(12) United States Patent
Wu et al.

(10) Patent No.: US 9,632,115 B2
(45) Date of Patent: Apr. 25, 2017

(54) METHOD FOR DERIVING CHARACTERISTIC VALUES OF MOS TRANSISTOR

(71) Applicant: United Microelectronics Corp., Hsinchu (TW)

(72) Inventors: Yi-Ting Wu, Taipei (TW); Cheng-Tung Huang, Kaohsiung (TW); Tsung-Han Lee, Tainan (TW); Yi-Han Ye, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 1017 days.

(21) Appl. No.: 13/894,021

(22) Filed: May 14, 2013

(65) Prior Publication Data

US 2014/0343880 A1 Nov. 20, 2014

(51) Int. Cl.
*G01R 19/00* (2006.01)
*G01R 31/26* (2014.01)

(52) U.S. Cl.
CPC ..... *G01R 19/0084* (2013.01); *G01R 31/2621* (2013.01)

(58) Field of Classification Search
CPC ............. G01R 19/0084; G01R 31/2621
See application file for complete search history.

(56) References Cited

PUBLICATIONS

J. J. Liou et al., "Extraction of the source and drain series resistances of MOSFETs" 1998, Chapter 5 of "Analysis and Design of MOSFETs" Kluwer Academic Publishers 1998 pp.*
Fleury et al., "A New Technique to Extract the Source/Drain Series Resistance of MOSFETs", 2009 IEEE Electron Device Letters, vol. 30, No. 9, Sep. 2009, pp. 975-977.*

(Continued)

*Primary Examiner* — Regis Betsch
(74) *Attorney, Agent, or Firm* — J.C. Patents

(57) ABSTRACT

A method for deriving characteristic values of a MOS transistor is described. A set of $\eta_k$ values is provided. A set of $V_{Bi}$ values (i=1 to M, M≥3) is provided. A set of $RSD_{i,j}$ (i=1 to M−1, j=i+1 to M) values each under a pair of $V_{Bi}$ and $V_{Bj}$, or a set of $V_{tq\_q,j}$ (q is one of 1 to M, j is 1 to M excluding q) values under $V_{Bq}$ is derived for each $\eta_k$, with an iteration method. The $\eta_k$ value making the set of $RSD_{i,j}$ values or $V_{tq\_q,j}$ values closest to each other is determined as an accurate $\eta_k$ value. The mean value of $RSD_{i,j}$ at the accurate $\eta_k$ value is calculated as an accurate RSD value.

10 Claims, 4 Drawing Sheets

(56) References Cited

PUBLICATIONS

Baek et al., "Characteristics of the Series Resistance Extracted From Si Nanowire FETs Using the Y-Function Technique", 2010, IEEE Transactions on Nanotechnology, vol. 9, No. 2, Mar. 2010 pp. 212-217.*

Lin et al., "A Constant-Mobility Method to Enable MOSFET Series-Resistance Extraction," IEEE Electron Device Letters 28(12), Dec. 2007, pp. 1132-1134.

Lin et al., "A Novel Method of MOSFET Series Resistance Extraction Featuring Constant Mobility Criteria and Mobility Universality," IEEE Transactions on Electron Devices 57(4), Apr. 2010, pp. 890-897.

Kim et al., "Accurate Extraction of Effective Channel Length and Source/Drain Series Resistance in Ultrashort-Channel MOSFETs by Iteration Method," IEEE Transactions on Electron Devices 55(10), Oct. 2008, pp. 2779-2784.

\* cited by examiner

METHOD FOR DERIVING CHARACTERISTIC VALUES OF MOS TRANSISTOR

BACKGROUND OF THE INVENTION

Field of Invention

This invention relates to a method for probing a MOS transistor, and particularly relates to a method for deriving characteristic values of a MOS transistor.

Description of Related Art

The sum (RSD) of the drain resistance $R_D$ and the source resistance $R_S$ and the effective carrier mobility $\mu_{eff}$ are important characteristic values for a MOS transistor. Recently, RSD extraction by using a single device is reported in two papers including Da-Wen Lin et al., IEEE Electron Device Letters, Vol. 28, No. 12, pp. 1132-1134, December 2007, and Da-Wen Lin et al., IEEE Transactions on Electron Devices, Vol. 57, No. 4, April 2010. The $\mu_{eff}$ value is directly calculated from the extracted RSD value. The single device of MOS transistor is illustrated in FIG. 1, together with the designation of certain parameters thereof that will be used hereafter.

The $V_t$ values at different bias configurations and the empirical factor $\eta$ (~3 for PFET and ~2 for NFET) are only inputs in the RSD equations in the above papers. However, if the values of $V_t$ and $\eta$ are not accurate, the extracted RSD and the $\mu_{eff}$ derived therefrom are not accurate either.

This invention gives a self-constant iteration method to find the accurate $V_t$ and $\eta$ so that determine the accurate RSD and $\mu_{eff}$.

SUMMARY OF THE INVENTION

In view of the foregoing, this invention provides a method for deriving correct characteristic values of a MOS transistor.

In the method for deriving correct characteristic values of a MOS transistor, the MOS transistor comprises a substrate, a gate, a channel region, a source and a drain, the threshold voltage of the channel region is $V_t$, the voltage applied to the substrate is $V_B$, the voltage applied to the gate is $V_G$, the voltage across the source and the drain is $V_{DS}$, the voltage across the gate and the source is $V_{GS}$, a $V_{GS}$ making the MOS transistor operate in a constant-mobility region is $V_{GS\_c}$, the current from the drain to the source is $I_{DS}$, and the sum of the resistance $R_D$ of the drain and the resistance $R_S$ of the source is RSD. When a correct $\eta$ value has been given, a correct RSD is derived by steps comprising the following steps a) to g). Step a) is applying different $V_{B1}$ and $V_{B2}$, respectively, to the substrate. Step b) is measuring $I_{DS1}$ and $I_{DS2}$ that correspond to $V_{B1}$ and $V_{B2}$, respectively. Step c) is giving respective initial values of $V_{t1}$ and $V_{t2}$, wherein $V_{t1}$ correspond to $V_{B1}$ and $V_{t2}$ corresponds to $V_{B2}$. Step d) is calculating RSD with the correct $\eta$ value, $V_{t1}$ and $V_{t2}$ by the equation of $$RSD = \left( \frac{V_{GS\_c} + (\eta-1)V_{t1} - \eta V_{t2} - 0.5 V_{DS}}{I_{DS2}} - \frac{V_{GS\_c} - V_{t1} - 0.5 V_{DS}}{I_{DS1}} \right) \times \frac{V_{DS}}{\eta \times (V_{t1} - V_{t2})}.$$

Step e) is plotting a $V_{GS}$-$I_{DS1\_exclude\_RSD}$ curve to derive $V_{GS\_a1}$ and plotting a $V_{GS}$-$I_{DS2\_exclude\_RSD}$ curve to derive $V_{GS\_a2}$, wherein $I_{DS1\_exclude\_RSD}$ and $I_{DS2\_exclude\_RSD}$ are calculated by the equations of $$I_{DS1\_exclude\_RSD} = \frac{I_{DS1} \times V_{DS}}{(V_{DS} - I_{DS1} \times RSD)}$$

and $$I_{DS2\_exclude\_RSD} = \frac{I_{DS2} \times V_{DS}}{(V_{DS} - I_{DS2} \times RSD)},$$

the $V_{GS}$ at the cross point on the $V_{GS}$ axis with a tangent line extrapolated from the point of the $V_{GS}$-$I_{DS1\_exclude\_RSD}$ curve where $dI_{DS1\_exclude\_RSD}/dV_{GS}$ is the maximal, and $V_{GS\_a2}$ is the $V_{GS}$ at the cross point on the $V_{GS}$ axis with a tangent line extrapolated from the point of the $V_{GS}$-$I_{DS2\_exclude\_RSD}$ curve where $dI_{DS2\_exclude\_RSD}/dV_{GS}$ is maximal. Step f) is calculating new $V_{t1}$ and $V_{t2}$ by using the equations of $V_{t1}=V_{GS\_a1}-V_{DS}/2$ and $V_{t2}=V_{GS\_a2}-V_{DS}/2$. Step g) is repeating the above steps d), e) and f) until RSD, $V_{t1}$ and $V_{t2}$ approach constant values.

Because such obtained RSD, $V_{t1}$, and $V_{t2}$ are correct values, correct $\mu_{eff1}$ and $\mu_{eff2}$ values corresponding to $V_{B1}$ and $V_{B2}$ can then be calculated by using the correct RSD, $V_{t1}$, and $V_{t2}$:

$$\mu_{eff1} = \frac{L_{eff}}{W_{eff} C_{ox}} \times \frac{I_{DS1}}{(V_{GS\_c} - V_{t1} - V_{DS}/2) \times (V_{DS} - RSD \times I_{DS1})}$$

$$\mu_{eff2} = \frac{L_{eff}}{W_{eff} C_{ox}} \times \frac{I_{DS2}}{(V_{GS\_c} - V_{t2} - V_{DS}/2) \times (V_{DS} - RSD \times I_{DS2})}$$

wherein $L_{eff}$ is the channel length, $W_{eff}$ is the channel width, and $C_{ox}$ is the inversion gate-oxide capacitance.

When the correct $\eta$ value is unknown, the method for deriving characteristic values of a MOS transistor of this invention includes the following steps to derive the correct $\eta$ value together with a correct RSD value. A set of $\eta_k$ values (k=1 to N) is provided. A set of $V_{Bi}$ values (i=1 to M, M≥3) is provided. For each $\eta_k$, a set of $RSD_{i,j}$ (i=1 to M-1, j=i+1 to M) values each under a pair of $V_{Bi}$ and $V_{Bj}$, a set of $\mu_{effp\_pj}$ (p is one of 1 to M, j is 1 to M excluding p) values under a given $V_{Bp}$, and/or a set of $V_{tq\_qj}$ (q is one of 1 to M, j is 1 to M excluding q) values under a given $V_{Bq}$ are derived by the iteration method described in the steps a) to g). Next, an accurate $\eta_k$ value, which makes the set of $RSD_{i,j}$ values closest to each other, makes the set of $\mu_{effp\_pj}$ values closest to each other, and/or makes the set of $V_{tq\_qj}$ closest to each other, is determined. The mean value of $RSD_{i,j}$ is calculated as an accurate value for RSD.

With the method for deriving characteristic values of a MOS transistor of this invention, the RSD value can be determined more accurately by a more precise $\eta$ value. Accurate $\eta$, RSD, $\mu_{eff}$, and $V_t$ could be obtained simultaneously and self-consistently.

In order to make the aforementioned and other objects, features and advantages of the present invention comprehensible, a preferred embodiment accompanied with figures is described in detail below.

DESCRIPTION OF EMBODIMENTS

It is noted that the following embodiments are intended to further explain this invention but not to limit the scope thereof. For example, though a correct η value is unknown and is to be determined in the illustrated embodiment, the method of this invention can also be applied to cases where a correct η value has been known.

Figure 2:
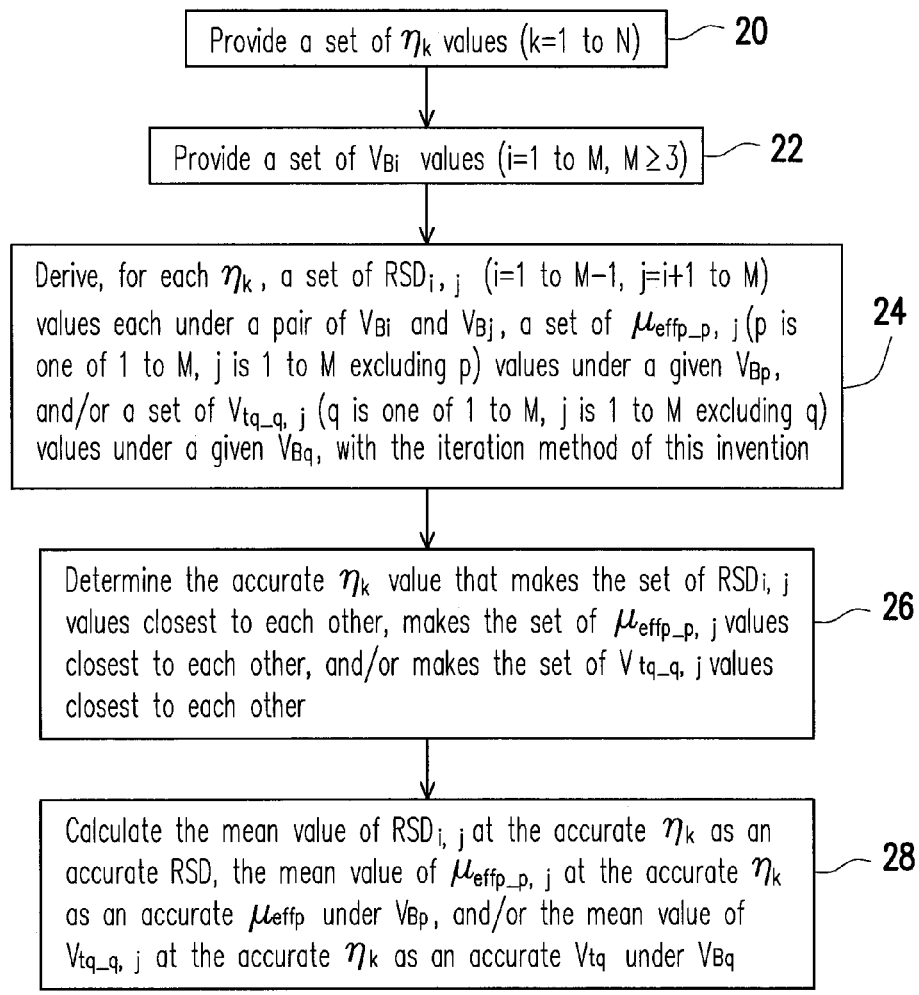
FIG. 2 illustrates a method for deriving characteristic values of a MOS transistor according to an embodiment of this invention.

FIG. 2 illustrates a method for deriving characteristic values of a MOS transistor according to an embodiment of this invention.

Referring to FIG. 2, in the step 20, a set of $\eta_k$ values (k=1 to N) is provided. The set of $\eta_k$ values are any non-identical positive real numbers larger than 1. In an exemplary embodiment, the $\eta_k$ values are chosen as 1.1, 1.2, 1.3 . . . 3.9 and 4.0, but not limit thereto.

In next step 22 shown in FIG. 2, a set of $V_{Bi}$ values (i=1 to M, M≥3) is provided. In an embodiment, M=3, and the different substrate biases $V_{B1}$, $V_{B2}$ and $V_{B3}$ are, for example, 0 V, −0.5 V and −1V for NFET, and, 0 V, 0.5V, and 1V for PFET, respectively.

In next step 24, For each $\eta_k$, derive a set of $RSD_{i,j}$ (i=1 to M−1, j=i+1 to M) values each under a pair of $V_{Bi}$ and $V_{Bj}$, a set of $\mu_{effp\_p,j}$ (p is one of 1 to M, j is 1 to M excluding p) values under a given $V_{Bp}$, and/or a set of $V_{tq\_q,j}$ (q is one of 1 to M, j is 1 to M excluding q) values under a given $V_{Bq}$ corresponding to $V_{Bi}$ and $V_{Bj}$ by the iteration method of this invention that is exemplified later in FIG. 3.

In an embodiment of M=3 where three different substrate biases $V_{B1}$, $V_{B2}$ and $V_{B3}$ are applied respectively, the set of $RSD_{i,j}$ values to be derived include: $RSD_{1,2}$ derived from $V_{B1}$ and $V_{B2}$, $RSD_{1,3}$ derived from $V_{B1}$ and $V_{B3}$, and $RSD_{2,3}$ derived from $V_{B2}$ and $V_{B3}$.

In an embodiment of M=3 where three different substrate biases $V_{B1}$, $V_{B2}$ and $V_{B3}$ are applied respectively and the $\mu_{eff1}$ value under $V_{B1}$ is investigated, the set of $\mu_{eff1\_1,j}$ values include: $\eta_{eff1\_1,2}$ derived from $V_{B1}$ and $V_{B2}$, and $\mu_{eff1\_1,3}$ derived from $V_{B1}$ and $V_{B3}$.

In an embodiment of M=3 where three different substrate biases $V_{B1}$, $V_{B2}$ and $V_{B3}$ are applied respectively and the $V_{t2}$ value under $V_{B2}$ is investigated, the set of $V_{t2\_2,j}$ values include: $V_{t2\_1,2}$ derived from $V_{B1}$ and $V_{B2}$, and $V_{t2\_2,3}$ derived from $V_{B2}$ and $V_{B3}$.

In next step 26, the accurate $\eta_k$ value, which makes the set of $RSD_{i,j}$ values closest to each other, makes the $\mu_{eff\_p,j}$ values closest to each other, and/or makes the $V_{tq\_q,j}$ values closest to each other, is determined.

In next step 28, the mean value of $RSD_{i,j}$ at the accurate $\eta_k$ value is calculated as an accurate RSD, the mean value of $\mu_{effp\_p,j}$ at the accurate $\eta_k$ value is calculated as an accurate $\mu_{effp}$ under the chosen $V_{Bp}$, and/or the mean value of $V_{tq\_q,j}$ at the accurate $\eta_k$ value is calculated as an accurate $V_{tq}$ under the chosen $V_{Bq}$.

Figure 3:
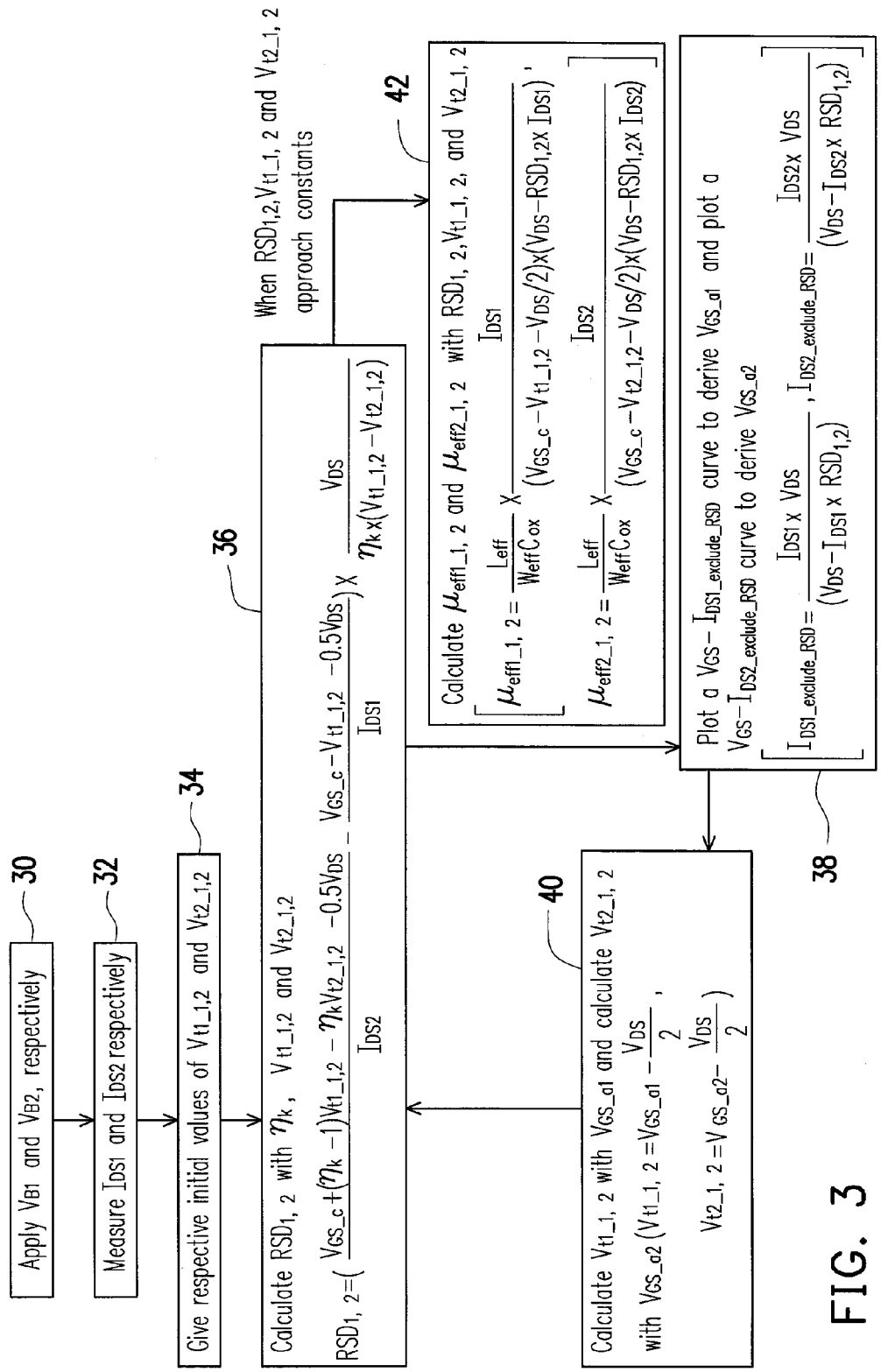
FIG. 3 illustrates the derivation of $RSD_{1,2}$, $V_{t1\_1,2}$, $V_{t2\_1,2}$, $\mu_{eff1\_1,2}$, and $\mu_{eff2\_1,2}$ for each $\eta_k$ value, as an example of the derivations of other $RSD_{i,j}$, $V_{ti\_i,j}$, $V_{tj\_i,j}$, $\mu_{effi\_i,j}$, and $\mu_{effj\_i,j}$, for the $\eta_k$ value.

The iterative derivation of $RSD_{i,j}$, $V_{ti\_i,j}$, $V_{tj\_i,j}$, $\mu_{effi\_i,j}$, and $\mu_{effj\_i,j}$ for each $\eta_k$ can be exemplified by the iterative derivation of $RSD_{1,2}$, $V_{t1\_1,2}$, $V_{t2\_1,2}$, $\mu_{eff1\_1,2}$, and $\mu_{eff2\_1,2}$ for a given $\eta_k$ value as illustrated in FIG. 3.

Figure 1:
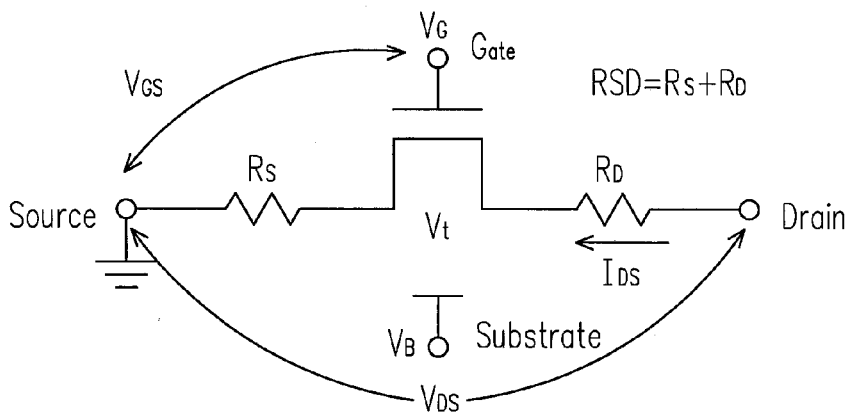
FIG. 1 illustrates a single device of MOS transistor whose characteristic values are to be investigated, together with the designation of certain parameters thereof.

Referring to FIG. 3, in step 30, the different $V_{B1}$ and $V_{B2}$ are respectively applied to the substrate, with the other voltages shown in FIG. 1 unchanged. In next step 32, the transistor current $I_{DS1}$ and $I_{DS2}$ that correspond to $V_{B1}$ and $V_{B2}$, respectively, are measured. In next step 34, respective initial values of $V_{t1}$ and $V_{t2}$ are given, wherein $V_{t1}$ correspond to $V_{B1}$, and $V_{t2}$ corresponds to $V_{B2}$. $V_{GS\_c}$ is a given $V_{GS}$ making the MOS transistor operate in a constant-mobility region, and the range of $V_{GS}$ corresponding to the constant-mobility region is determined by the well-known method described in the papers mentioned in [0002].

In next step 36, RSD is calculated with the $\eta_k$ value, $V_{t1\_1,2}$ and $V_{t2\_1,2}$ by the equation of $$RSD_{1,2} = \left( \frac{V_{GS\_c} + (\eta_k - 1)V_{t1\_1,2} - \eta_k V_{t2\_1,2} - 0.5V_{DS}}{I_{DS2}} - \frac{V_{GS\_c} - V_{t1\_1,2} - 0.5V_{DS}}{I_{DS1}} \right) \times \frac{V_{DS}}{\eta_k \times (V_{t1\_1,2} - V_{t2\_1,2})}$$

In next step 38, a $V_{GS}$–$I_{DS1\_exclude\_RSD}$ curve is plotted to derive $V_{GS\_a1}$, and a $V_{GS}$–$I_{DS2\_exclude\_RSD}$ curve is plotted to derive $V_{GS\_a2}$, wherein $I_{DS1\_exclude\_RSD}$ and $I_{DS2\_exclude\_RSD}$ are calculated by the equations of $$I_{DS1\_exclude\_RSD} = \frac{I_{DS1} \times V_{DS}}{(V_{DS} - I_{DS1} \times RSD_{1,2})}$$

and $$I_{DS2\_exclude\_RSD} = \frac{I_{DS2} \times V_{DS}}{(V_{DS} - I_{DS2} \times RSD_{1,2})},$$

is the $V_{GS}$ at the cross point on the $V_{GS}$ axis with a tangent line extrapolated from the point of the $V_{GS}$–$I_{DS1\_exclude\_RSD}$ curve where $dI_{DS1\_exclude\_RSD}/dV_{GS}$ is maximal, and $V_{GS\_a2}$ is the $V_{GS}$ at the cross point on the $V_{GS}$ axis with a tangent line extrapolated from the point of the $V_{GS}$–$I_{DS2\_exclude\_RSD}$ curve where $dI_{DS2\_exclude\_RSD}/dV_{GS}$ is maximal.

Figure 4:
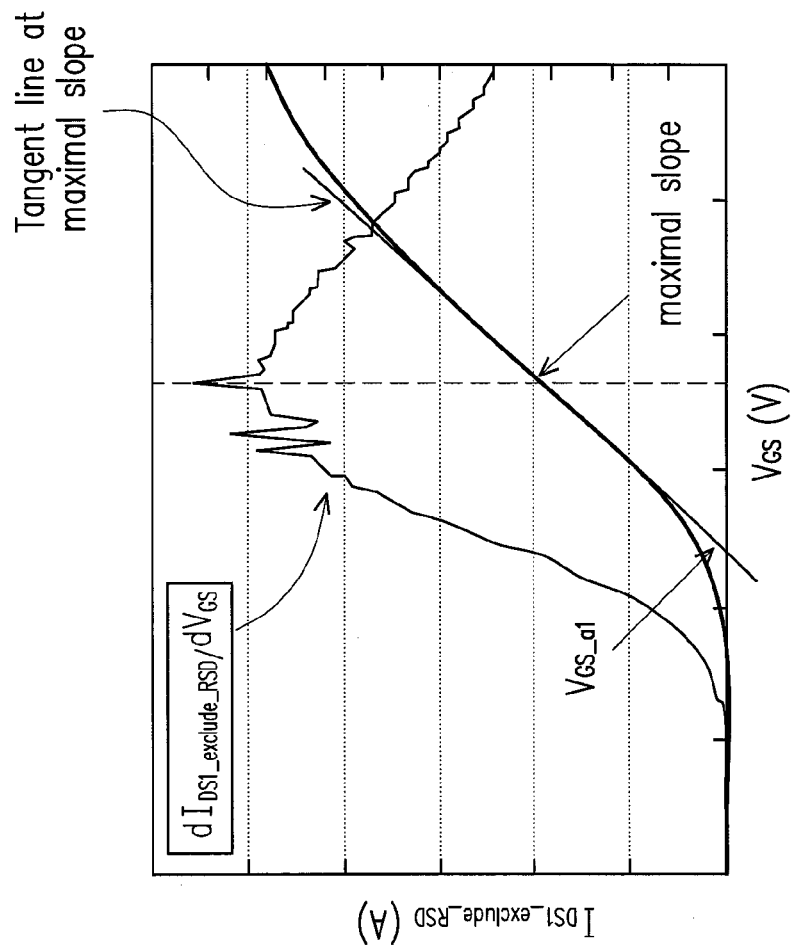
FIG. 4 illustrates the method of deriving $V_{GS\_a1}$ by plotting a $V_{GS}$-$_{DS1\_exclude\_RSD}$ curve, as an example of deriving $V_{GS\_ai}$ (i=1, 2 . . . ).

The method of deriving $V_{GS\_a1}$ from the plotted $V_{GS}$–$I_{DS1\_exclude\_RSD}$ curve is taken as an example of deriving $V_{GS\_ai}$ from the plotted $V_{GS}$–$I_{DS1\_exclude\_RSD}$ as shown in FIG. 4. Referring to FIGS. 1 and 4, to plot the $V_{GS}$–$I_{DS1\_exclude\_RSD}$ curve, a series of $V_G$'s are respectively applied to the gate of the MOS transistor while the substrate bias is fixed at $V_{B1}$, the corresponding series of $V_{GS}$'s are calculated from the series of $V_G$'s, the corresponding series of $I_{DS1}$'s are measured, the corresponding series of $I_{DS1\_exclude\_RSD}$'S are calculated by the equation of $$I_{DS1\_exclude\_RSD} = \frac{I_{DS1} \times V_{DS}}{(V_{DS} - I_{DS1} \times RSD_{1,2})},$$

and the $I_{DS1\_exclude\_RSD}$ curve values are plotted with respect to the $V_{GS}$. The first-order differential of $I_{DS1\_exclude\_RSD}$ with respect to $V_{GS}$ is plotted to determine the point of the curve with the maximal slope, a tangent line is plotted at the maximal-slope point of the curve, and the intercept of the tangent line with the x-axis is determined as $V_{GS\_a1}$. $V_{GS\_a2}$ can be derived from the $V_{GS}$–$I_{DS2\_exclude\_RSD}$ curve in a similar manner.

In next step 40, $V_{t1\_1,2}$ is calculated with $V_{GS\_a1}$ and $V_{t2\_1,2}$ is calculated with $V_{GS\_a2}$, by the equations of $V_{t1\_1,2}=V_{GS\_a1}-V_{DS}/2$ and $V_{t2\_1,2}=V_{GS\_a2}-V_{DS}/2$. The above steps 36, 38 and 40 are repeated until $RSD_{1,2}$, $V_{t1\_1,2}$ and $V_{t2\_1,2}$ approach constant values without change after several times iterations.

In step 42, $\mu_{eff1\_1,2}$ and $\mu_{eff2\_1,2}$ values can be calculated from the above derived $RSD_{1,2}$ $V_{t1\_1,2}$, and $V_{t2\_1,2}$ values, by the equation of $$\mu_{eff1\_1,2} = \frac{L_{eff}}{W_{eff}C_{ox}} \times \frac{I_{DS1}}{(V_{GS\_c} - V_{t1\_1,2} - V_{DS}/2) \times (V_{DS} - RSD_{1,2} \times I_{DS1})},$$

$$\mu_{eff2\_1,2} = \frac{L_{eff}}{W_{eff}C_{ox}} \times \frac{I_{DS2}}{(V_{GS\_c} - V_{t2\_1,2} - V_{DS}/2) \times (V_{DS} - RSD_{1,2} \times I_{DS2})}$$

wherein $L_{eff}$ is the channel length, $W_{eff}$ is the channel width, and $C_{ox}$ is the inversion gate-oxide capacitance.

Figure 5:
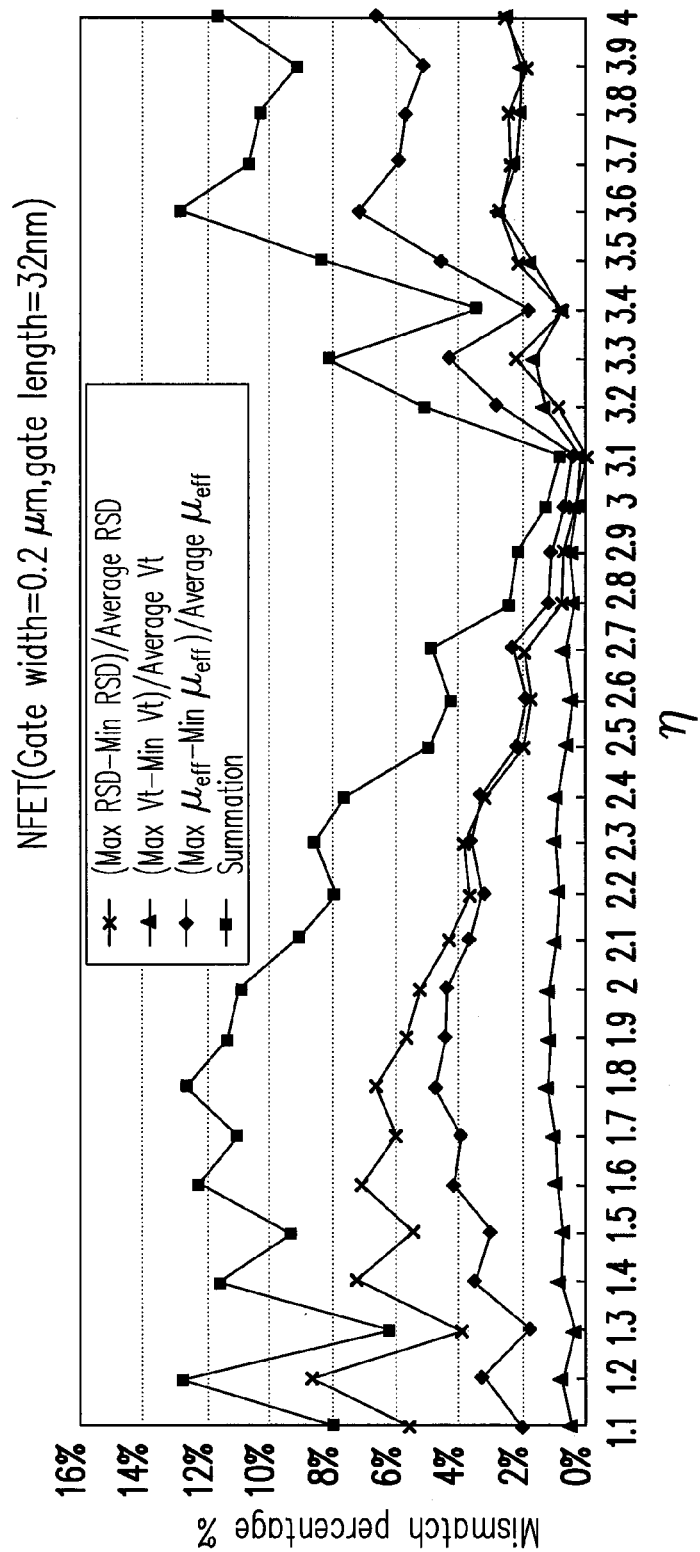
FIG. 5 shows determination of the accurate $\eta_k$ value that makes the set of $RSD_{i,j}$ values, $\mu_{effp\_p,j}$ values or $V_{tq\_q\_j}$ values closest to each other in an example of this invention.

FIG. 5 shows determination of the $\eta_k$ value that makes the set of $RSD_{i,j}$ values, $\mu_{effp\_pj}$ values or $V_{tq\_qj}$ values closest to each other in an example of this invention. In the example, the set of $\eta_k$ values used were 1.1, 1.2, 1.3 . . . 3.9 and 4.0 (N=30), and three different biases (M=3), $V_{B1}$=0 V, $V_{B2}$=−0.5 V and $V_{B3}$=−1V, were applied to the substrate of an NFET, respectively. For each $\eta_k$ value, $RSD_{1,2}$, $RSD_{1,3}$ $RSD_{2,3}$, $\mu_{eff1\_1,2}$, $\mu_{eff\_1,3}$, $V_{t1\_1,2}$ and $V_{t1\_1,3}$ were derived based on the method shown in FIGS. 3-4.

Referring to FIG. 5, for each $\eta_k$ value, how the set of $RSD_{1,2}$, $RSD_{1,3}$ and $RSD_{2,3}$, the set of $\mu_{eff1\_1,2}$ and $\mu_{eff\_1,3}$, or the set of $V_{t1\_1,2}$ and $V_{t1\_1,3}$ are close to each other was determined by the ratio of the difference between the maximal value and the minimal value in the set of values to the average of the set of values. Because "3.1" was the $\eta$ value that made the set of RSD, $\mu_{eff1}$ or $V_{t1}$ values closest to each other, it was the accurate $\eta$ value, and the corresponding RSD, $\mu_{eff1}$, or $V_{t1}$ calculated as the mean value of $RSD_{1,2}$, $RSD_{1,3}$ and $RSD_{2,3}$, the mean value of $\mu_{eff1\_1,2}$ and $\mu_{eff\_1,3}$, or the mean value of $V_{t1\_1,2}$ and $V_{t1\_1,3}$ was also the accurate value.

With the method for deriving characteristic values of a MOS transistor of this invention, the RSD value and the $\mu_{eff}$ value can be determined more accurately, and a more precise $\eta$ value can be obtained as well.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for deriving characteristic values of a MOS transistor, wherein the MOS transistor comprises a substrate, a gate, a channel region, a source and a drain, a threshold voltage of the channel region is $V_t$, a voltage applied to the substrate is $V_B$, a voltage applied to the gate is $V_G$, a voltage across the source and the drain is $V_{DS}$, a voltage across the gate and the source is $V_{GS}$, a $V_{GS}$ making the MOS transistor operate in a constant-mobility region is $V_{GS\_c}$, a current from the drain to the source is $I_{DS}$, and a sum of a resistance $R_D$ of the drain and a resistance $R_S$ of the source is RSD, the method comprising:

a) applying different $V_{B1}$ and $V_{B2}$, respectively, to the substrate;

b) measuring $I_{DS1}$ and $I_{DS2}$ that correspond to $V_{B1}$ and $V_{B2}$, respectively;

c) giving respective initial values of $V_{t1}$ and $V_{t2}$, wherein $V_{t1}$ corresponds to $V_{B1}$ and $V_{t2}$ corresponds to $V_{B2}$;

d) calculating RSD with a given $\eta$ value, $V_{t1}$ and $V_{t2}$ by an equation of $$RSD = \left(\frac{V_{GS\_c} + (\eta-1)V_{t1} - \eta V_{t2} - 0.5V_{DS}}{I_{DS2}} - \frac{V_{GS\_c} - V_{t1} - 0.5V_{DS}}{I_{DS1}}\right) \times \frac{V_{DS}}{\eta \times (V_{t1} - V_{t2})};$$

e) applying a series of $V_G$'s respectively to the gate while the voltage applied to the substrate is fixed at $V_{B1}$, calculating a corresponding series of $V_{GS}$'s from the series of $V_G$'s and measuring a corresponding series of $I_{DS1}$'s to plot a plot of $V_{GS}$ vs. $I_{DS1\_exclude\_RSD}$ to derive $V_{GS\_a1}$, and applying a series of $V_G$'s respectively to the gate while the voltage applied to the substrate is fixed at $V_{B2}$, calculating a corresponding series of $V_{GS}$'s from the series of $V_G$'s and measuring a corresponding series of $I_{DS2}$'s to plot a plot of $V_{GS}$ vs. $I_{DS2\_exclude\_RSD}$ to derive $V_{GS\_a2}$, wherein $I_{DS1\_exclude\_RSD}$ and $I_{DS2\_exclude\_RSD}$ are calculated by equations of $$I_{DS1\_exclude\_RSD} = \frac{I_{DS1} \times V_{DS}}{(V_{DS} - I_{DS1} \times RSD)}$$

and $$I_{DS2\_exclude\_RSD} = \frac{I_{DS2} \times V_{DS}}{(V_{DS} - I_{DS2} \times RSD)};$$

$V_{GS\_a1}$ is the $V_{GS}$ at a cross point on the $V_{GS}$ axis with a tangent line extrapolated from a point of the $V_{GS}$-$I_{DS1\_exclude\_RSD}$ curve where $dI_{DS1\_exclude\_RSD}/dV_{GS}$ is maximal, and $V_{GS\_a2}$ is the $V_{GS}$ at a cross point on the $V_{GS}$ axis with a tangent line extrapolated from a point of the $V_{GS}$-$I_{DS2\_exclude\_RSD}$ curve where $dI_{DS2\_exclude\_RSD}/dV_{GS}$ is maximal;

f) calculating $V_{t1}$ with $V_{GS\_a1}$, and calculating $V_{t2}$ with $V_{GS\_a2}$, by equations of $$V_{t1} = V_{GS\_a1} - \frac{V_{DS}}{2}$$

and $$V_{t2} = V_{GS\_a2} - \frac{V_{DS}}{2};$$

and g) repeating the steps d), e) and f) several times until RSD, $V_{t1}$ and $V_{t2}$ approach constant values without change.

2. The method of claim 1, further comprising deriving effective carrier mobility $\mu_{eff1}$ and $\mu_{eff2}$ under $V_{B1}$ and $V_{B2}$, respectively, by equations of $$\mu_{eff1} = \frac{L_{eff}}{W_{eff}C_{ox}} \times \frac{I_{DS1}}{(V_{GS\_c} - V_{t1} - V_{DS}/2) \times (V_{DS} - RSD \times I_{DS1})}$$

$$\mu_{eff2} = \frac{L_{eff}}{W_{eff}C_{ox}} \times \frac{I_{DS2}}{(V_{GS\_c} - V_{t2} - V_{DS}/2) \times (V_{DS} - RSD \times I_{DS2})},$$

wherein $L_{eff}$ is a channel length, $W_{eff}$ is a channel width, and $C_{ox}$ is an inversion gate-oxide capacitance.

3. A method for deriving characteristic values of a MOS transistor, wherein the MOS transistor comprises a substrate, a gate, a channel region, a source and a drain, a threshold voltage of the channel region is $V_t$, a voltage applied to the substrate is $V_B$, a voltage applied to the gate is $V_G$, a voltage across the source and the drain is $V_{DS}$, a voltage across the gate and the source is $V_{GS}$, a $V_{GS}$ making the MOS transistor operate in a constant-mobility region is $V_{GS\_c}$, a current from the drain to the source is $I_{DS}$, and a sum of a resistance $R_D$ of the drain and a resistance $R_S$ of the source is RSD, the method comprising:

providing a set of $\eta_k$ values (k=1 to N);
providing a set of $V_{Bi}$ values (i=1 to M, M≥3);
for each $\eta_k$, derive a set of $RSD_{i,j}$ (i=1 to M−1, j=i+1 to M) values each under a pair of $V_{Bi}$ and $V_{Bj}$, a set of $\mu_{effp\_p,j}$ (p is one of 1 to M, j is 1 to M excluding p) values each under a $V_{Bp}$, and/or a set of $V_{tq\_q,j}$ (q is one of 1 to M, j is 1 to M excluding q) values each under a $V_{Bq}$ by the method of claim 2;
determine an accurate $\eta_k$ value that makes the set of $RSD_{i,j}$ values closest to each other, makes the set of $\mu_{effp\_p,j}$ values closest to each other, and/or makes the set of $V_{tq\_q,j}$ values closest to each other; and
calculating a mean value of $RSD_{i,j}$ at the accurate $\eta_k$ value as an accurate value of RSD.

4. The method of claim 3, wherein how the set of $RSD_{i,j}$ values, $\mu_{effp\_p,j}$ values or $V_{tq\_q,j}$ values are close to each other is determined by a ratio of a difference between a maximal value and a minimal value in the set of values to an average of the set of values.

5. The method of claim 3, further comprising:
calculating a mean value of $\mu_{effp\_p,j}$ at the accurate $\eta_k$ value as an accurate value of $\mu_{effp}$ under $V_{Bp}$; and/or
calculating a mean value of $V_{tq\_q,j}$ at the accurate $\eta_k$ value as an accurate value of $V_{tq}$ under $V_{Bq}$.

6. The method of claim 3, wherein M is equal to 3, and three different biases $V_{B1}$, $V_{B2}$ and $V_{B3}$ are respectively applied to the substrate.

7. A method for deriving characteristic values of a MOS transistor, wherein the MOS transistor comprises a substrate, a gate, a channel region, a source and a drain, a threshold voltage of the channel region is $V_t$, a voltage applied to the substrate is $V_B$, a voltage applied to the gate is $V_G$, a voltage across the source and the drain is $V_{DS}$, a voltage across the gate and the source is $V_{GS}$, a $V_{GS}$ making the MOS transistor operate in a constant-mobility region is $V_{GS\_c}$, a current from the drain to the source is $I_{DS}$, and a sum of a resistance $R_D$ of the drain and a resistance $R_S$ of the source is RSD, the method comprising:

providing a set of $\eta_k$ values (k=1 to N);
providing a set of $V_{Bi}$ values (i=1 to M, M≥3);
for each $\eta_k$, derive a set of $RSD_{i,j}$ (i=1 to M−1, j=i+1 to M) values each under a pair of $V_{Bi}$ and $V_{Bj}$, and/or a set of $V_{tq\_q,j}$ (q is one of 1 to M, j is 1 to M excluding q) values each under a $V_{Bq}$ by the iteration method described in the steps a) to g) of claim 1;
determine an accurate $\eta_k$ value that makes the set of $RSD_{i,j}$ values closest to each other, and/or makes the set of $V_{tq\_q,j}$ values closest to each other; and
calculating a mean value of $RSD_{i,j}$ at the accurate $\eta_k$ value as an accurate value of RSD.

8. The method of claim 7, wherein how the set of $RSD_{i,j}$ values or $V_{tq\_q,j}$ values are close to each other is determined by a ratio of a difference between a maximal value and a minimal value in the set of values to an average of the set of values.

9. The method of claim 7, further comprising:
calculating a mean value of $V_{tq\_q,j}$ at the accurate $\eta_k$ value as an accurate value of $V_{tq}$ under $V_{Bq}$.

10. The method of claim 7, wherein M is equal to 3, and three different biases $V_{B1}$, $V_{B2}$ and $V_{B3}$ are respectively applied to the substrate.

* * * * *